United States Patent [19]
Date et al.

[11] Patent Number: 5,252,920
[45] Date of Patent: Oct. 12, 1993

[54] MAGNETIC CHARACTERISTICS MEASURING APPARATUS WITH A BALANCING MECHANISM

[76] Inventors: Muneyuki Date, 813 Pastrorale-Heim-Toyonaka, 7-16, Uenonishi 4-chome, Toyonaka-shi, Osaka; Akio Yamagishi, 2-710 Minoo-Sun-Royal, 8, Makiochi 5-chome, Minoo-shi, Osaka, both of Japan

[21] Appl. No.: 886,328

[22] Filed: May 20, 1992

[30] Foreign Application Priority Data

May 24, 1991 [JP] Japan .................... 3-120316

[51] Int. Cl.$^5$ .................... G01R 33/12; G01R 33/16; G01N 27/72
[52] U.S. Cl. .................... 324/228; 324/201; 324/226; 324/239; 324/262
[58] Field of Search .............. 324/201, 204, 225, 226, 324/228, 239, 262

[56] References Cited
U.S. PATENT DOCUMENTS 3,665,296 5/1972 Gross et al. .................... 324/201
3,879,658 4/1975 Hummel .................... 324/201
3,904,956 9/1975 O'Brien et al. .................... 324/228

FOREIGN PATENT DOCUMENTS 1285418 1/1987 U.S.S.R. .................... 324/201

Primary Examiner—Gerard R. Strecker
Attorney, Agent, or Firm—Bruce L. Adams; Van C. Wilks

[57] ABSTRACT

A magnetic characteristics measuring apparatus attains high sensitivity measurement of magnetic characteristics of a specimen. A magnetic field is applied for a predetermined time to the specimen, which is suspended from a beam at one side of a balance, by a solenoid electromagnet, thereby imparting a magnetic force on the specimen. The free oscillating amplitude of the balance following removal of the magnetic force is detected by a laser micro-range finder. Magnetic characteristics of the specimen are measured based on a relationship between the oscillating amplitude and the intensity of the applied magnetic field. The influence of magnetic noise or of magnetic characteristics of the measuring apparatus itself is eliminated, and a very high sensitivity on the order of less than $10^{-12}$ emu is realized in finding magnetic susceptibility with a simple structure.

20 Claims, 5 Drawing Sheets

MAGNETIC CHARACTERISTICS MEASURING APPARATUS WITH A BALANCING MECHANISM

BACKGROUND OF THE INVENTION

The present invention relates to an apparatus for measuring magnetic characteristics of materials and more particularly to a magnetic characteristic measuring apparatus that can measure magnetic susceptibility of biomagnetic characteristics with a very high sensitivity.

Various methods and apparatuses for measuring magnetic characteristics have been proposed in the past. For example, the Faraday method is a method for measuring magnetic characteristics of a specimen using the magnitude of a drive current applied to a dynamic system to dynamically balance the magnetic force that acts on the specimen placed within a certain magnetic field. A specimen oscillation method utilizes a design such that when a specimen mounted on a moving coil is oscillated in a certain magnetic field, current induced in the moving coil is influenced by magnetic characteristics of the specimen. An apparatus shown in FIG. 8 measures magnetic characteristics of a specimen 19 by applying alternating magnetic fields to the specimen 19 mounted at the tip of a quartz rod 18 to oscillate the specimen 19, and by converting the oscillation by an electrostrictive element 20 mounted at the bottom of the quartz rod 18 to analyze the oscillation.

However, the aforementioned Faraday method or the specimen oscillation method have a limited measuring sensitivity due to magnetic noise caused by ripple and switching noise of a power source since the magnetic field is applied during measuring. Moreover, it has been difficult to enhance the sensitivity of the measuring apparatus shown in FIG. 8 due to the influence of magnetic noise as well as to being limited by the characteristics of the electrostrictive element that converts amplitudes to electrical signals.

SUMMARY OF THE INVENTION

It is an object of the present invention to provide an apparatus that allows measurement of magnetic characteristics of a specimen with very high sensitivity using a relatively simple structure which is not adversely influenced by magnetic noise.

According to the present invention, a pulsed electromagnet is used as an electromagnet for generating a magnetic field that acts on a specimen to generate a pulsed or sine wave-shaped one shot magnetic field or a periodic magnetic field for a specific time period. The specimen is suspended from a simple dynamic oscillation system having a balancing mechanism comprising, for example, a balance, springs and a pendulum. A displacement detecting means such as a laser micro-range finder that can detect amplitudes of the dynamic oscillation system with high resolution without contact is provided.

The specimen suspended from the dynamic oscillation system is place at a position where the product of spatial magnetic field gradient (dH(t)/dz) and intensity of the magnetic field (H(t)) becomes the largest. The force F which the specimen receives at this time is:

$$F = xH(t)dH(t)/dz \quad \quad (1)$$

where, x is the magnetic susceptibility of the specimen. Receiving this force, the dynamic oscillation system starts to oscillate and its oscillating amplitude is detected by the displacement detecting means. The magnetic field that effects on the specimen is a one shot magnetic field which extinguishes after a predetermined time, and the oscillating amplitude may be enlarged by selecting the time of applying the magnetic field as the natural oscillation period of the dynamic oscillation system in a resonating relationship. The oscillating amplitude is detected in free oscillating state after the extinction of the magnetic field, so that the influence of magnetic noise may be avoided. Magnetic susceptibility, which is one of the magnetic characteristics of the specimen, may be found without any noise, from the oscillating amplitude obtained and the intensity of the magnetic field applied.

According to the apparatus of the present invention as structured above high sensitivity such as in the order of $10^{-12}$ emu may be realized. Thus, it allows measurement of even very small specimens and it may be applied in the biotechnological field where the behavior of bacteria, for example, is tracked from the aspect of magnetic characteristics. Furthermore, it allows ready measurement of magnetic characteristics of a specimen having a magnetic anisotropy and eliminates the influence of the magnetic characteristics of the measuring apparatus itself on measured results.

DETAILED DESCRIPTION OF THE PREFERRED EMBODIMENT

Figure 1:
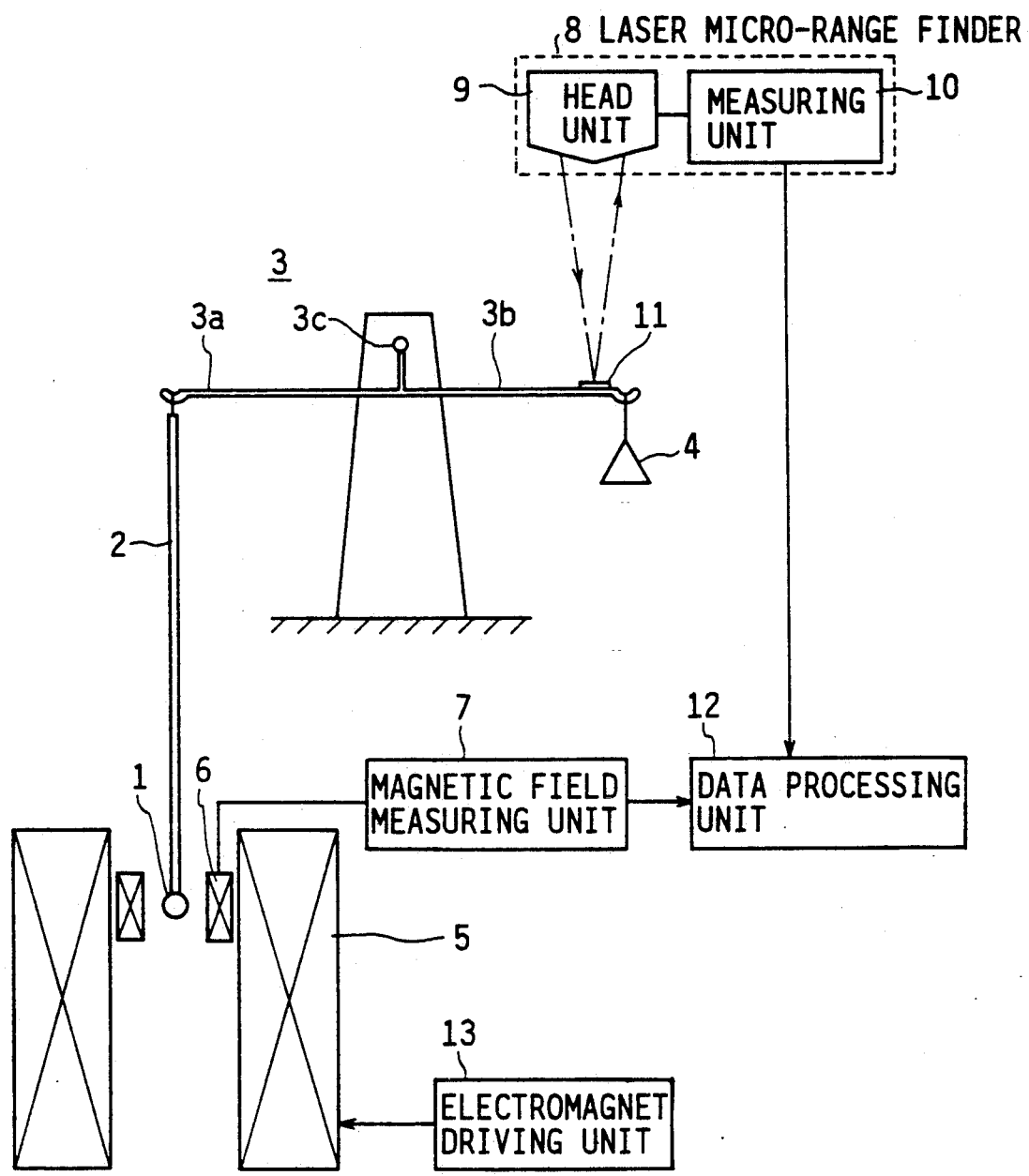
FIG. 1 is a schematic drawing illustrating a basic structure of the present invention.

Referring now to the drawings, preferred embodiments of the present invention will be explained.

FIG. 1 is a schematic drawing illustrating a basic structure of the present invention. In the figure, a specimen 1 whose magnetic characteristics are to be measured is suspended from a beam 3a of a balance 3 through the intermediary of a supporting rod 2 made from quartz. A counter balance 4 for balancing the balance 3 about a supporting point 3c is suspended from another beam 3b of the balance 3. An electro-magnet 5 is a solenoid magnet that generates a magnetic force which acts on the specimen 1 and is driven by an electromagnet driving unit 13. The specimen 1 is placed at a position where a product of gradient of the magnetic field that is generated in the cavity and the intensity of the magnetic field becomes largest. Then the intensity of the magnetic field applied to the specimen 1 is measured by a magnetic field sensor 6 disposed for monitoring the magnetic field generated near the specimen 1 and by a magnetic field measuring unit 7 disposed for measuring the magnetic field from the output of the magnetic field sensor 6. A laser micro-range finder 8 monitors unbalanced motion (oscillation) of the balance 3 when the magnetic force is applied to the specimen 1.

A laser beam is irradiated to a reflecting plate 11 mounted at the end portion of the beam 3b from a light emitting section of a head unit 9. Then its reflected light is detected by a light receiving section of the head unit 9 and very small amplitudes of the balance 3 during the oscillating state and measured by a measuring unit 10. Then a data processing unit 12 determines magnetic characteristics of the specimen 1 from both the measured intensity of the magnetic field and the measured physical displacement or oscillating amplitudes.

Figure 2A:
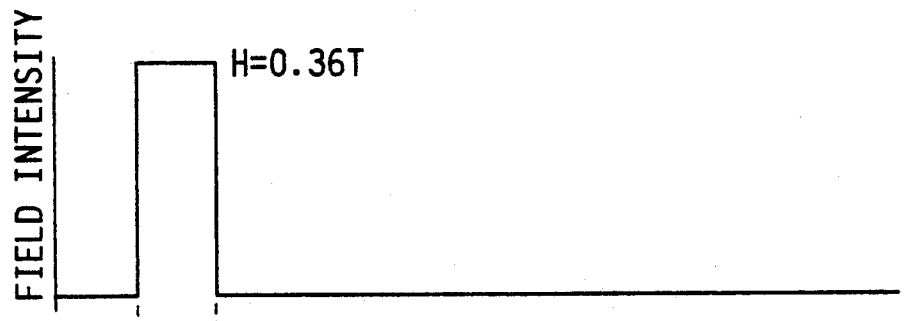
FIGS. 2A and 2B are graphs respectively illustrating a waveform of a pulsed magnetic field applied to a specimen and an oscillating waveform of a balance.
Figure 2B:
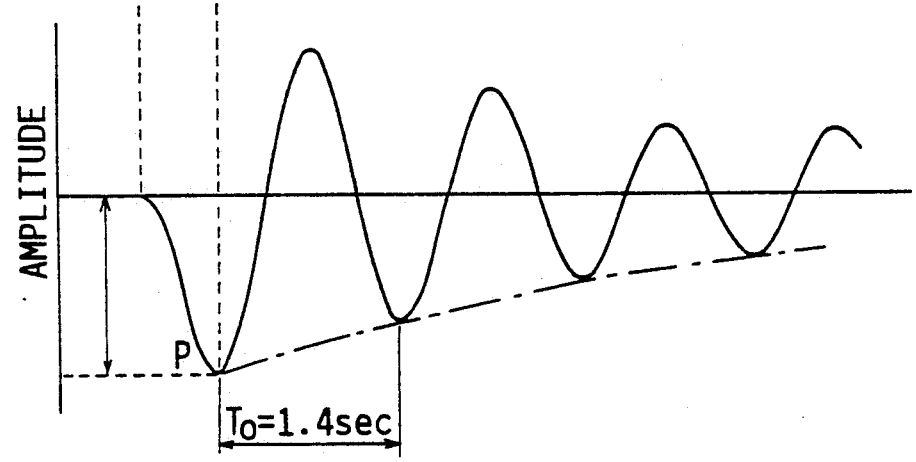

FIGS. 2A and 2B illustrate an example wherein 20 mg of Mohr's salt ($x=6.2\times10^{-7}$ emu), a paramagnetic salt used as a reference specimen in measuring magnetic susceptibility (x), was measured by the apparatus of the present invention.

FIG. 2A illustrates a pulsed magnetic field which is applied to the specimen and which has an intensity of $H=0.36$ Tesla and whose time duration is approximately 1 second. FIG. 2B illustrates an oscillating waveform of the balance 3 generated by the pulsed magnetic field which has an oscillation period $T_0=1.4$ sec. The oscillating waveform in FIG. 2B indicates a free oscillation accompanying attenuation, and its amplitude gradually decreases after cessation of the pulsed magnetic field. An amplitude P immediately after the cessation of the pulsed magnetic field may be obtained by finding an envelope of the attenuating oscillating waveform. That is, the amplitude P may be obtained without being influenced by noise caused by the pulsed magnetic field or any other background magnetic fields.

Figure 3:
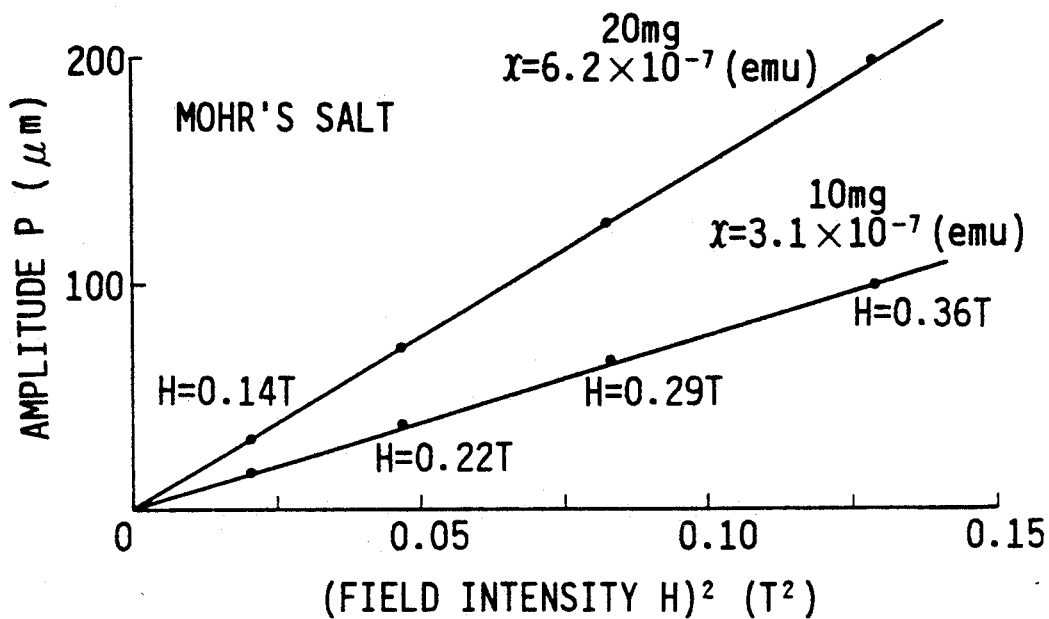
FIG. 3 is a diagram illustrating a relationship between the intensity of magnetic fields applied to Mohr's salt and the amplitude of the oscillating waveforms.

FIG. 3 illustrates results when the same measurements as in FIG. 2 are carried out while changing the intensity of the magnetic field. From the figure, it can be seen that the amplitude P is proportional to the square of the intensity of the magnetic field. In the figure, measuring results for 10 mg Mohr's salt ($x=3.1\times10^{-7}$ emu) are also shown. This graph also shows a good linear relationship between the amplitude P and the square of the intensity of the magnetic field.

Figure 4:
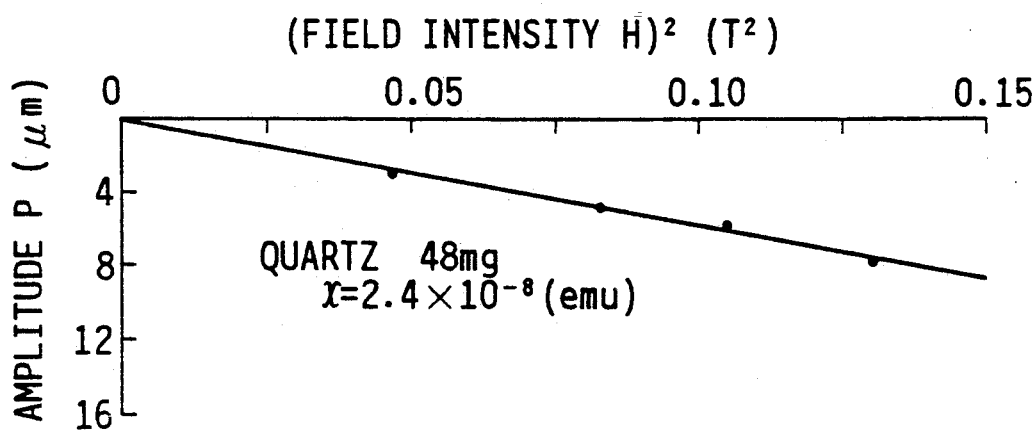
FIG. 4 is a diagram illustrating a relationship between the intensity of a magnetic field applied to quartz and the amplitude of the oscillating waveform.

FIG. 4 illustrates an example in which 48 mg of quartz ($x=2.4\times10^{-8}$ emu), a diamagnetic substance, was measured using the apparatus of the present invention. Although the direction of motion against the applied magnetic field is opposite to that in the case of a paramagnetic substance, the relationship between the amplitude P and the square of the intensity of the magnetic field is linear, similar to the case of FIG. 3.

Figure 5:
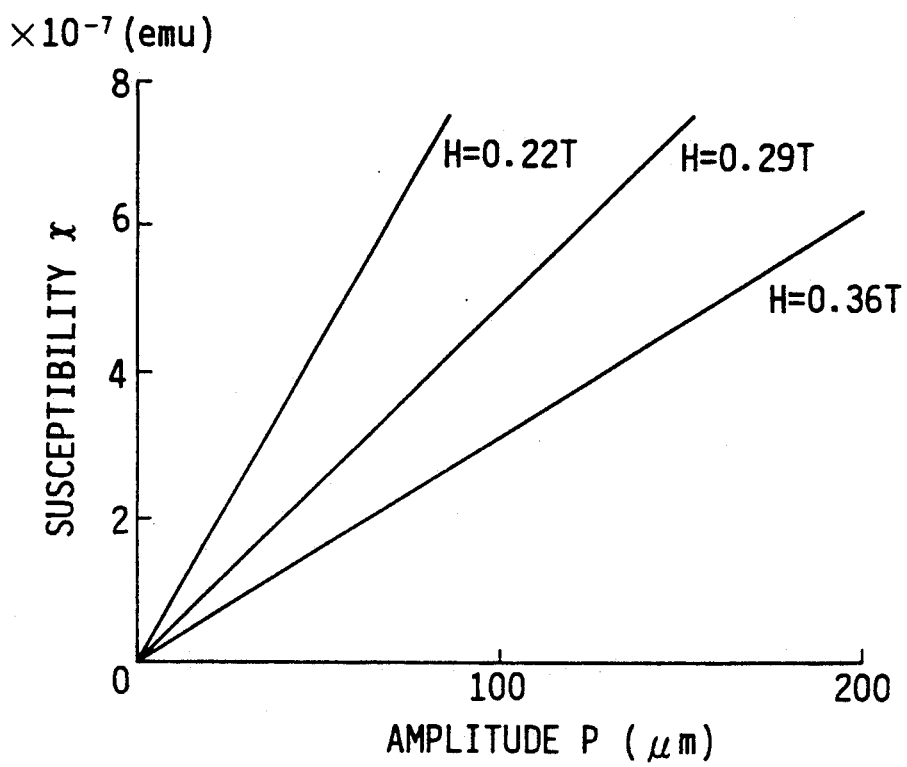
FIG. 5 is a diagram illustrating calibration lines for finding magnetic susceptibility of a specimen from the oscillating amplitude.

From the results of the measurement of specimens having a known magnetic susceptibility such as in FIGS. 3 and 4, calibration lines as shown in FIG. 5 may be obtained. That is, the magnetic susceptibility of a specimen having an unknown magnetic susceptibility may be found from an amplitude P measured when a predetermined magnetic field intensity is applied. It is also possible to calculate the magnetic susceptibility of an unknown specimen by automatic numerical operation by storing data which corresponds to these calibration lines into a memory as a look-up table.

Next, description will be made regarding the usefulness of the apparatus of the present invention in measuring anisotropic susceptibility ($\Delta x$) of a diamagnetic substance having a magnetic anisotropy and in eliminating fluctuation of measured values adversely influenced by the magnetic susceptibility of a measuring apparatus itself.

Figure 6:
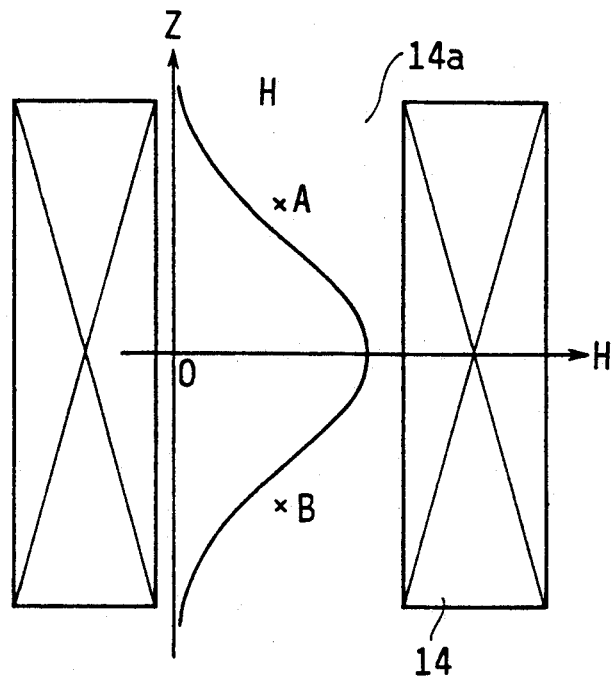
FIG. 6 is a diagram illustrating a distribution of a magnetic field of a solenoid for generating a magnetic field.

FIG. 6 is a drawing illustrating the distribution H of a magnetic field in a cavity 14a of a solenoid 14 used for generating the magnetic field used in the apparatus of the present invention. As seen from the magnetic distribution H, there are two points A and B in FIG. 6 where the product of the gradient and the intensity of the magnetic field becomes largest in the cavity 14a.

Although quartz is almost insusceptible to any influence by a magnetic field and so is used as the supporting rod for supporting the specimen, the small influence of magnetic susceptibility on the quartz that exists adversely effects measured values and cannot be ignored if the sensitivity of the apparatus is increased. In such a case, the supporting rod made from quartz is elongated so as to penetrate through the cavity 14a, not just to point A. At this time, magnetic forces having the same magnitude in opposite directions act on the supporting rod at the upper and lower half regions of the cavity 14a, so that they offset each other, and the influence of the magnetic susceptibility of the supporting rod may be eliminated, thereby enabling very high sensitive measurement.

In another embodiment, a polyester fiber of 10 microns is used for the supporting rod for supporting the specimen. It is easier for the polyester fiber, in comparison with the quartz, to eliminate the influence of the magnetic susceptibility of the supporting rod itself, because of its uniformity and low volume.

Figure 7A:
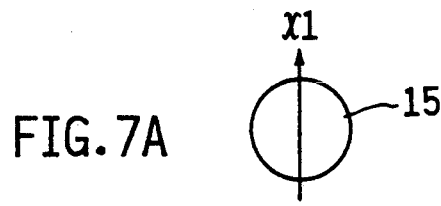
FIGS. 7A and 7B are a drawing illustrating magnetic susceptibility in the direction along the disk surface of a red blood cell and a drawing illustrating magnetic susceptibility in the direction vertical to the disk surface of a red blood cell, respectively.
Figure 7B:
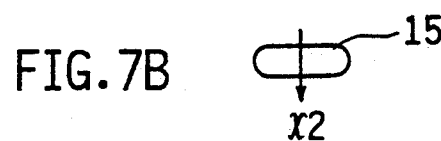
Figure 8:
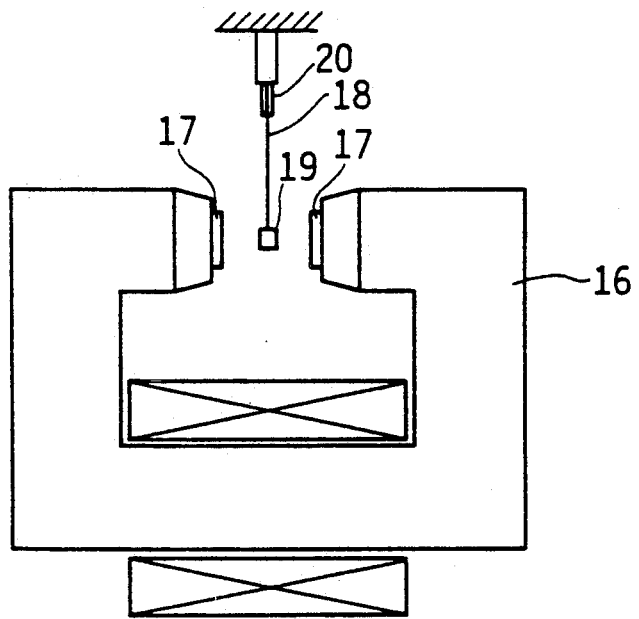
FIG. 8 is a schematic drawing illustrating a prior art magnetic characteristics measuring apparatus.

Moreover, if specimens placed at point A and point B have the same magnetic characteristics, the magnetic forces act in opposite directions respectively and offset each other. On the other hand, when specimens having different magnetic characteristics (e.g. magnetic susceptibility) are placed at point A and point B, the magnetic forces act on the dynamic oscillation system (balance) to a degree that corresponds to a difference in their magnetic susceptibilities. For example, a disk shaped red blood cell 15, which is a biological substance having diamagnetic characteristics shown in FIGS. 7A and 7B, has a magnetic susceptibility x1 along the surface of the disk (FIG. 7A) and a magnetic susceptibility x2 in the direction vertical to the disk surface (FIG. 7B), which differ from each other anisotropic susceptibility of the red blood cell $\Delta x=x1-x2$ may be found by placing a red blood cell positioned as shown in FIG. 7A at point A in FIG. 6 and by placing another red blood cell positioned as shown in FIG. 7B at point B in FIG. 6.

When magnetic susceptibility (x) of a specimen is to be measured, the measuring sensitivity of the apparatus of the present invention is proportional to the square of the intensity of the applied magnetic field, the duration of the applied magnetic field and the oscillation period of the balance. Since the measuring sensitivity corresponds to the oscillating amplitude of the balance, oscillating amplitude generated under a predetermined time duration of application of the magnetic field and a predetermined oscillation period of the balance is proportional to the square of the intensity of the magnetic field. That is, to improve the measuring sensitivity, such means may be taken as to increase the intensity of the magnetic field, to increase the measuring resolution of the oscillating amplitude and to enlarge the oscillating amplitude, for example, by using principles of the lever.

As for the intensity of the magnetic field, about $6\times10^{-9}$ emu of sensitivity with 0.3 Tesla have been obtained in the present embodiment (see FIGS. 3 and 4), so that when 10 Tesla magnetic field (which is a feasible level) is applied, the sensitivity may be enhanced by about 1000 times.

Although the one shot magnetic field has been applied in the present embodiment, it is possible to enlarge the oscillating amplitude by resonating the one shot magnetic field with the free oscillation period of the balance by synchronizing and by repeating it for a certain time period. Although the measuring resolution of the oscillation amplitude is 2 microns in the described embodiment of the present invention, this may be improved relatively easily. Furthermore, in terms of the enlargement of the oscillating amplitude, it is possible to enlarge the oscillating amplitude of the specimen by elongating the beam on the counter balance side of the balance more than the beam on the specimen side by ratio of the length of both beams. By taking such steps, the measuring sensitivity of the apparatus of the present invention may be enhanced to less than $10^{-12}$ emu relatively easily. This sensitivity is higher than the SQUID (superconducting quantum interference device) method, which is conventionally considered to have the highest sensitivity, by 10 to 100 times. And the apparatus of the present invention does not require an extremely low temperature atmosphere for superconductivity as does the SQUID method and yet allows measurement with very high sensitivity and with a very simple structure.

As described above, the magnetic characteristics measuring apparatus of the present invention has advantages that very high sensitivity measurement may be realized with a very simple structure and without being adversely influenced by magnetic noise caused by an applied magnetic field or any other background magnetic fields. The apparatus of the present invention only needs the pulsed electro-magnet that generates a one shot magnetic field, the dynamic oscillation system and the displacement detecting means, and simply measures the oscillating amplitude of the dynamic oscillation system after extinction of the one shot magnetic field.

Furthermore, the apparatus of the present invention has other advantages such as that the magnetic characteristics of a substance having a magnetic anisotropy can be readily measured and that the influence of magnetic characteristics of the apparatus itself on measured results may be eliminated.

What is claimed is:

1. A magnetic characteristics measuring apparatus for measuring magnetic parameters of a specimen, comprising:

mechanical balancing means for supporting and balancing a specimen in a measuring region;
    magnetic field generating means for applying a magnetic force generated electro-magnetically for a predetermined period of time to the specimen in said measuring region;
    displacement detecting means for detecting displacement of said mechanical balancing means responsive to a motion of the specimen caused by said magnetic force and for outputting displacement data corresponding to the displacement of said mechanical balancing means;
    magnetic field detecting means for detecting a magnetic field in a vicinity of the specimen in said measuring region and for outputting magnetic field data corresponding to the magnetic field applied to the specimen; and
    data processing means responsive to said displacement data and said magnetic field data for ascertaining the magnetic parameters of the specimen corresponding to said displacement data and said magnetic field data.

2. A magnetic characteristics measuring apparatus according to claim 1, wherein the mechanical balancing means comprises first beam means for suspending the specimen in the measuring region, and second beam means for suspending a counterbalance weight to balance the suspended specimen in the measuring region.

3. A magnetic characteristics measuring apparatus according to claim 2; wherein said first beam means of said mechanical balancing means has two holders for suspending said specimen, each holder being placed at a symmetrical position in a distribution of the magnetic field within said magnetic field generating means.

4. A magnetic characteristics measuring apparatus according to claim 2; wherein the first and second beam means comprise a single beam.

5. A magnetic characteristics measuring apparatus according to claim 1; wherein the data processing means includes means storing information representative of calibration lines obtained from displacement data and magnetic field data having known magnetic parameters.

6. A magnetic characteristics measuring apparatus according to claim 1; wherein the data processing means includes a look-up table storing displacement data and magnetic field data corresponding to known magnetic parameters.

7. A magnetic characteristics measuring apparatus according to claim 1; wherein said displacement detecting means includes means for detecting displacement in a free oscillation state of said mechanical balancing means after applying a magnetic force for the predetermined period of time.

8. A magnetic characteristics measuring apparatus according to claim 1; wherein said magnetic field generating means comprises means for generating said magnetic force by a one shot pulsed magnetic field.

9. A magnetic characteristics measuring apparatus according to claim 1; wherein said displacement detecting means includes a laser micro-range finder for monitoring unbalanced motion of said mechanical balancing means.

10. A magnetic characteristics measuring apparatus, comprising:

means for holding a specimen having a measurable magnetic characteristic to enable the specimen to undergo displacement in a measuring region;
    means for applying a magnetic force to the specimen in the measuring region to cause the magnetic force to interact with the specimen to produce a characteristic magnetic field in the vicinity of the specimen and to cause physical displacement of the specimen;
    means for measuring the characteristic magnetic field in the vicinity of the specimen;
    means for measuring the displacement of the specimen due to the applied magnetic force; and means for determining a magnetic characteristic of the specimen based on the measured magnetic field and the measured displacement of the specimen.

11. A magnetic characteristics measuring apparatus according to claim 10; wherein the means for holding the specimen comprises a first beam for suspending the specimen within the measuring region and a second beam for counterbalancing the suspended specimen.

12. A magnetic characteristics measuring apparatus according to claim 11; wherein the first beam and the second beam comprise parts of a single pivotally-supported beam.

13. A magnetic characteristics measuring apparatus according to claim 10; wherein the means for applying a magnetic force comprises an electromagnet, and means for exciting the electromagnet to create the magnetic force.

14. A magnetic characteristics measuring apparatus according to claim 13; wherein the means for exciting the electromagnet comprises means for exciting the electromagnet to produce a one-shot magnetic force effective to enable measurement of the magnetic characteristic of the specimen.

15. A magnetic characteristics measuring apparatus according to claim 10; wherein the means for applying a magnetic force comprises means for producing a one-shot magnetic force effective to enable measurement of the magnetic characteristic of the specimen.

16. A magnetic characteristics measuring apparatus according to claim 10; wherein the means for measuring the magnetic field comprises a magnetic field sensor for detecting and outputting information indicative of the characteristic magnetic field in the vicinity of the specimen, and a magnetic field measuring unit for measuring the characteristic magnetic field in accordance with the magnetic field information outputted by the magnetic field sensor.

17. A magnetic characteristics measuring apparatus according to claim 10; wherein the means for measuring the displacement comprises a laser range finder for monitoring unbalanced motion of the means for holding the specimen.

18. A magnetic characteristics measuring apparatus according to claim 10; wherein the means for determining a magnetic characteristic of the specimen comprises a data processing unit receptive of data representative of the measured magnetic field and the measured displacement of the specimen for determining therefrom the magnetic characteristic of the specimen.

19. A method for measuring a magnetic characteristic of a specimen, comprising the steps:
supporting and balancing a specimen having a measurable magnetic characteristic in a measuring region;
applying a magnetic force to the specimen while in the measuring region to thereby produce a characteristic magnetic field in the vicinity of the specimen and to cause a physical displacement of the specimen;
measuring the characteristic magnetic field in the vicinity of the specimen;
measuring the physical displacement of the specimen; and
obtaining a magnetic characteristic of the specimen based on the measured magnetic field and the measured physical displacement of the specimen.

20. A method according to claim 19; wherein the step of applying a magnetic force comprises electromagnetically applying a magnetic force only for a predetermined time period and then ceasing application of the magnetic force.

* * * * *

UNITED STATES PATENT AND TRADEMARK OFFICE
CERTIFICATE OF CORRECTION

PATENT NO. : 5,252,920
DATED : October 12, 1993
INVENTOR(S) : Muneyuki DATE and Akio YAMAGISHI It is certified that error appears in the above-indentified patent and that said Letters Patent is hereby corrected as shown below:

On the Title page, after item [76] please insert item --[73]

Assignee: Seiko Instruments, Inc., Japan--.

Signed and Sealed this

Twenty-first Day of January, 1997

Attest:

BRUCE LEHMAN

*Attesting Officer*      *Commissioner of Patents and Trademarks*